US012587179B2

(12) United States Patent
Klimov

(10) Patent No.: US 12,587,179 B2
(45) Date of Patent: Mar. 24, 2026

(54) RING OSCILLATOR-BASED TRUE RANDOM NUMBER GENERATOR

(71) Applicant: Arm Limited, Cambridge (GB)

(72) Inventor: Alexander Klimov, Hadera (IL)

(73) Assignee: ARM LIMITED, Cambridge (GB)

( * ) Notice: Subject to any disclaimer, the term of this patent is extended or adjusted under 35 U.S.C. 154(b) by 0 days.

(21) Appl. No.: 18/768,959

(22) Filed: Jul. 10, 2024

(65) Prior Publication Data

US 2026/0019068 A1 Jan. 15, 2026

(51) Int. Cl.
| | |
|---|---|
| *H03K 3/84* | (2006.01) |
| *G06F 7/58* | (2006.01) |
| *H03K 3/03* | (2006.01) |
| H03K 19/20 | (2006.01) |

(52) U.S. Cl.
CPC .............. *H03K 3/84* (2013.01); *G06F 7/588* (2013.01); *H03K 3/0315* (2013.01); *H03K 19/20* (2013.01)

(58) Field of Classification Search
CPC ........ H03K 3/84; H03K 3/0315; H03K 19/20; G06F 7/588
USPC .......................................................... 327/164
See application file for complete search history.

(56) References Cited

U.S. PATENT DOCUMENTS

| | | | | | |
|---|---|---|---|---|---|
| 6,065,029 | A * | 5/2000 | Weiss | ...................... | G06F 7/584 |
| | | | | | 708/251 |
| 7,124,155 | B2 * | 10/2006 | Hars | ........................ | H03K 3/84 |
| | | | | | 708/250 |
| 8,260,835 | B2 * | 9/2012 | Fukushima | ............. | G06F 7/588 |
| | | | | | 708/251 |
| 8,410,857 | B2 * | 4/2013 | Dichtl | ...................... | H03K 3/84 |
| | | | | | 708/251 |
| 8,624,634 | B1 * | 1/2014 | Luzzi | ....................... | H03K 3/84 |
| | | | | | 327/124 |
| 9,465,585 | B2 * | 10/2016 | Lewis | ..................... | G06F 7/588 |
| 2004/0107230 | A1 * | 6/2004 | Bardouillet | ............. | H03K 3/84 |
| | | | | | 708/252 |
| 2004/0264233 | A1 * | 12/2004 | Fukushima | ............ | G11C 29/36 |
| | | | | | 365/145 |
| 2008/0183788 | A1 * | 7/2008 | Song | ....................... | G06F 7/588 |
| | | | | | 708/251 |
| 2009/0077146 | A1 * | 3/2009 | Hars | ......................... | G06F 7/58 |
| | | | | | 708/251 |
| 2009/0077147 | A1 * | 3/2009 | Hars | ....................... | G06F 7/588 |
| | | | | | 708/251 |
| 2009/0327381 | A1 * | 12/2009 | Morad | .................. | H04L 9/0861 |
| | | | | | 708/252 |
| 2010/0106757 | A1 * | 4/2010 | Matthews, Jr. | .......... | G06F 7/58 |
| | | | | | 708/251 |
| 2010/0169045 | A1 * | 7/2010 | Shin | ................. | G01R 31/31727 |
| | | | | | 702/179 |

(Continued)

*Primary Examiner* — Ryan Jager

(74) *Attorney, Agent, or Firm* — Talem IP Law, LLP

(57) ABSTRACT

A true random number generator (TRNG) as described herein can include a ring oscillator; and a sampling circuit coupled to an intermediate node of the ring oscillator, wherein the sampling circuit includes a reset, wherein the ring oscillator and the sampling circuit are formed of components from a standard cell library. The sampling circuit includes a storage cell selected for having a shortest oscillation period of a data input of the storage cell that results in a non-constant output. The reset of the sampling circuit can include a logic gate or be built-in reset functionality of the storage cell.

19 Claims, 8 Drawing Sheets

(56) References Cited

U.S. PATENT DOCUMENTS

| | | | | |
|---|---|---|---|---|
| 2010/0281088 A1* | 11/2010 | Wilber | .................... | G06F 7/588 |
| | | | | 708/251 |
| 2011/0163818 A1* | 7/2011 | Dichtl | .................... | G06F 7/588 |
| | | | | 331/57 |
| 2013/0346458 A1* | 12/2013 | Boehl | .................... | G06F 7/588 |
| | | | | 708/250 |
| 2015/0019602 A1* | 1/2015 | Lewis | ................. | H03M 7/6011 |
| | | | | 708/203 |
| 2015/0193205 A1* | 7/2015 | Boehl | .................... | G06F 7/588 |
| | | | | 708/250 |
| 2015/0199174 A1* | 7/2015 | Boehl | ..................... | G06F 7/58 |
| | | | | 708/250 |
| 2016/0179472 A1* | 6/2016 | Sugahara | ............... | G06F 7/588 |
| | | | | 708/250 |
| 2016/0253153 A1* | 9/2016 | Bucci | .................... | G06F 21/602 |
| | | | | 708/251 |
| 2021/0141608 A1* | 5/2021 | Do | ......................... | H03K 19/21 |
| 2022/0374206 A1* | 11/2022 | Fukushima | .............. | G06F 7/58 |
| 2022/0399883 A1* | 12/2022 | Fay | ......................... | H03K 3/84 |
| 2024/0128957 A1* | 4/2024 | Benea | ..................... | H03K 3/84 |
| 2024/0329115 A1* | 10/2024 | Owczarczyk | ........ | H03K 3/0315 |

* cited by examiner

Q0
(S1)

Q1

Q2

Q0
(S1)

Q1

Q2

400

410

SO

EN

S1    S2    SO

Reset

CK

Sampling Circuit

420

SO

EN

S1    S2    SO

420

Reset

CK1

A    N1

430

440

Q0    Q1    Q2

F1    F2

CK

CK2

600

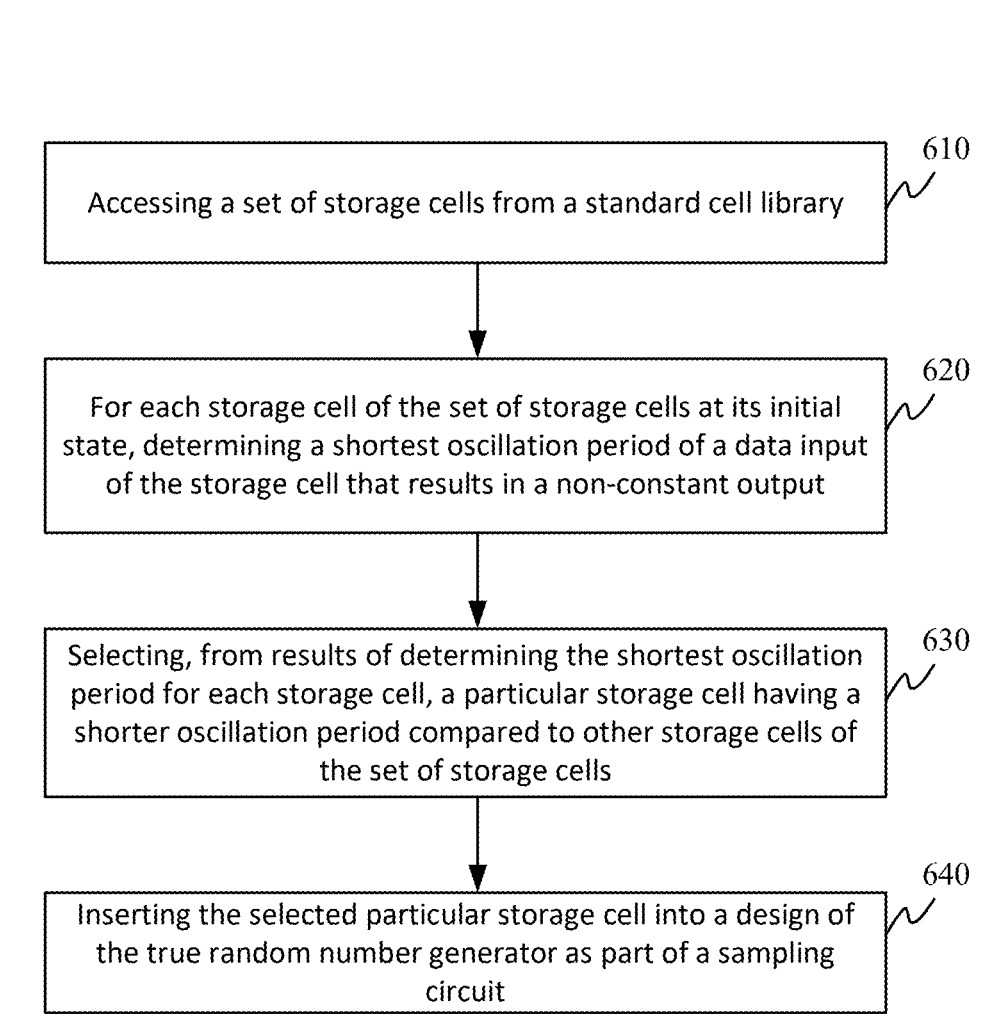

610

Accessing a set of storage cells from a standard cell library

620

For each storage cell of the set of storage cells at its initial state, determining a shortest oscillation period of a data input of the storage cell that results in a non-constant output

630

Selecting, from results of determining the shortest oscillation period for each storage cell, a particular storage cell having a shorter oscillation period compared to other storage cells of the set of storage cells

640

Inserting the selected particular storage cell into a design of the true random number generator as part of a sampling circuit

FIG. 6

RING OSCILLATOR-BASED TRUE RANDOM NUMBER GENERATOR

BACKGROUND

True Random Number Generators (TRNGs) use real world random occurrences to generate a stream of random/unpredictable numbers. Unpredictability is referred to as entropy, which can be measured in bits.

TRNGs can be based on oscillatory metastability, which, in the context of electronics, refers to the ability of an electronic system to be in an unstable, or intermediate, state between a logic 0 and logic 1. Oscillatory metastability can be found in free-running ring oscillators. Free-running ring oscillators are not locked to other clocks and can accumulate jitter due to many unpredictable effects, including thermal noise. By sampling the ring oscillator at a sufficiently low frequency such that the phase of the oscillator can drift more than a full oscillation period in the average, it is possible to generate entropy. The sampling can leverage the transitional waveforms or by measuring time until settling (e.g., by counting pulses). Length of the oscillator and timer/sampling time can be selected as part of the design.

In circuits incorporating TRNGs, the TRNGs are typically designed from standard cells. As a result, the sampling circuitry typically relies on standard flops. However, as applications begin requiring faster sampling speeds, the sufficiently low sampling frequencies currently used to capture the entropy from the ring oscillator operation become too slow for the desired faster sampling speeds. This creates a tension with the desire to continue to use standard cells and implement faster sampling speeds.

BRIEF SUMMARY

Ring oscillator-based true random number generators (TRNG) are described. A method is provided for generating an optimum sampling design of a ring oscillator-based TRNG using a predefined standard cell library. Standard cell libraries are collections of well characterized basic circuits that electronic design automation (EDA) tools use to implement a higher-level circuit design. Advantageously, ring oscillator-based TRNGs as described herein can be designed using standard cell libraries while allowing for the higher operating frequencies desired by various applications, including cryptographic applications such as key generation and signing.

A TRNG as described herein can include a ring oscillator; and a sampling circuit coupled to an intermediate node of the ring oscillator, wherein the sampling circuit includes a reset, wherein the ring oscillator and the sampling circuit are formed of components from a standard cell library.

A method for standard cell selection for design of a TRNG can include accessing, by a computing system, a set of storage cells from a standard cell library; for each storage cell of the set of storage cells at its initial state, determining, by the computing system, a shortest oscillation period of a data input of the storage cell that results in a non-constant output; selecting, by the computing system, from results of determining the shortest oscillation period for each storage cell, a particular storage cell having a shorter oscillation period compared to other storage cells of the set of storage cells; and inserting, by the computing system, the selected particular storage cell into a design of the TRNG as part of the sampling circuit.

A computer-readable storage medium can be provided having instructions stored thereon that when executed by a computing system direct the computing system to: find, from a standard cell library, a flop or latch which allows to sample a fastest oscillating signal; insert the flop or latch into a design of a TRNG, the TRNG including a ring oscillator and a sampling circuit coupled to an intermediate node of the ring oscillator, wherein the sampling circuit includes a reset; identify whether the flop or latch has reset functionality; and if the flop or latch does not have reset functionality, determine a gate for providing the reset for the flop or latch, and insert the gate into the design of the TRNG.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 6 shows a method for standard cell selection for design of a TRNG.

DETAILED DESCRIPTION

Ring oscillator-based true random number generators (TRNG) are described. A method is provided for generating an optimum sampling design of a ring oscillator-based TRNG using a predefined standard cell library. The described method enables improved security and speed of a fully digital ring oscillator-based TRNG.

Figure 1:
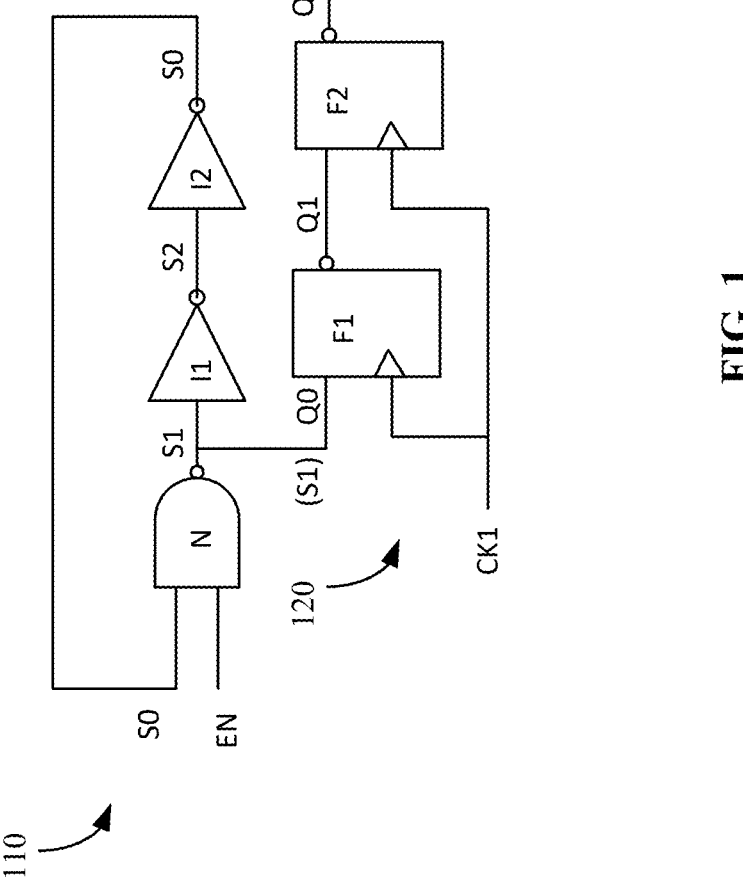
FIG. 1 shows an example ring oscillator-based TRNG.

FIG. 1 shows an example ring oscillator-based TRNG. A ring oscillator 110 contains an odd number of inverter-like cells. For example, a ring oscillator 110 can include three cells: a NAND gate N and two inverters I1 and I2. NAND gate N is used to stop oscillation when oscillation is not needed (e.g., high EN enables oscillation) and the inverters I1 and I2 contribute to the delay of the signal in the loop and resulting oscillating frequency. Conventionally, as shown in FIG. 1, the output of one stage of the ring oscillator 110 (e.g., output S1) is sampled by a series of flip-flops 120 (e.g., two inverting flip-flops F1 and F2), where S1 is connected to Q0, which is the data input of the first flip-flop. Bits of entropy are collected at the output Q2.

Figure 2:
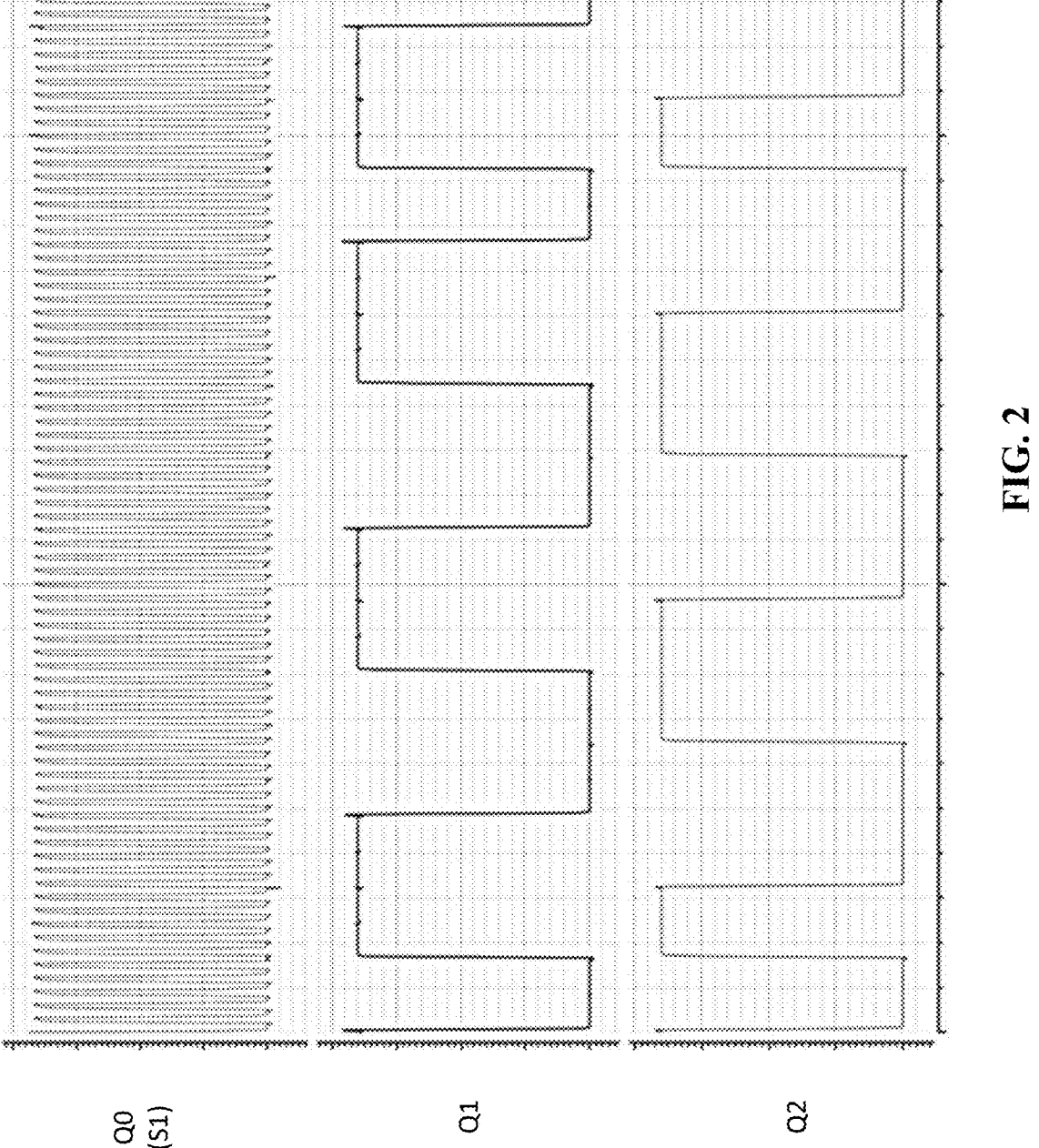
FIG. 2 shows a signal plot illustrating operation of a ring oscillator-based TRNG with a typical sampling rate.

For static timing analysis (STA) used for digital implementation, the flip-flop standard cell used to implement flip-flops F1 and F2 is characterized with three timings: setup, hold, and delay (ts, th, and td). If the data input is stable for setup time (ts) before and hold time (th) after the active clock edge, then the output is ready a delay time (td)

amount of time after the edge. This leads to the recommendation for the period of the ring oscillator to be significantly larger (e.g., 10 times) than the sum of ts and th. This ensures that during sampling, most of the time Q0 is stable as required by the STA discipline. FIG. 2 shows a signal plot illustrating operation of a ring oscillator-based TRNG with a typical sampling rate. Referring to FIG. 2, the signals at nodes Q0, Q1, and Q2 are shown for a relatively slow ring oscillator: Q1 is sometimes 0 and sometimes 1.

While convenient for the digital implementation flow, this approach (e.g., relatively slow sampling) has significant performance implications. For example, the time needed to collect a predefined number of bits of entropy depends on the period of the ring oscillator 110. The smaller the period, the faster the collection and (assuming each inverter has the same jitter) a ring oscillator with ten times shorter period allows entropy to be collected 100 times faster. However, fully digital ring oscillator-based TRNGs using standard cell libraries have limitations and the sampling can become stuck. A sampling that is "stuck" refers to a constant output by the sampler (e.g., a constant value captured for each sample). For a ring oscillator-based TRNG to be functional, a non-constant output is needed.

Figure 3:
FIG. 3 shows a signal plot illustrating operation of the ring oscillator-based TRNG of FIG. 1 operating at a higher oscillation frequency for the ring oscillator.

FIG. 3 shows a signal plot illustrating operation of the ring oscillator-based TRNG of FIG. 1 operating at a higher oscillation frequency for the ring oscillator. Referring to FIG. 3, the signals at nodes Q0, Q1, and Q2 are shown for a ring oscillator-based TRNG configured as shown in FIG. 1. It can be seen that while storing 0 (1 on inverting output Q1), the first flip-flop F1 switched its state, but in the new state, the sampler is stuck. This can occur when initially storing a 0 or when initially storing a 1. As can be seen, the design of FIG. 1 cannot be used with such a fast ring oscillator.

However, through the described methods for generating an optimum sampling design of a ring oscillator-based TRNG using a predefined standard cell library, it is possible to design a ring oscillator-based TRNG capable of sampling the higher oscillation frequency for the ring oscillator.

Figure 4A:
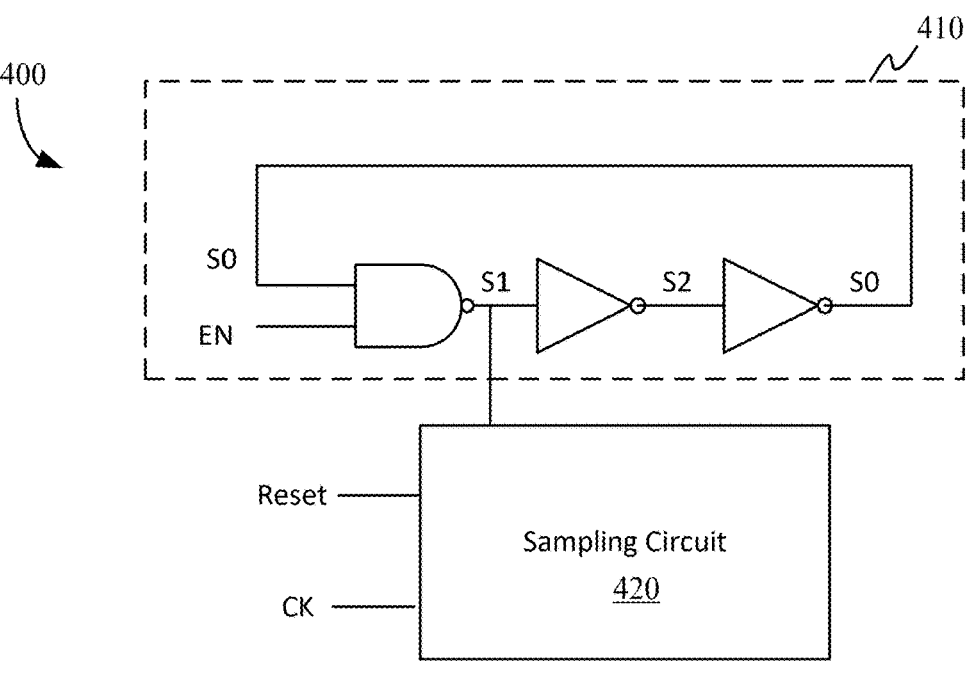
FIG. 4A shows an example ring oscillator-based TRNG capable of handling operating at high frequencies.

FIG. 4A shows an example ring oscillator-based TRNG capable of handling operating at high frequencies. Referring to FIG. 4A, TRNG 400 includes a ring oscillator 410 and a sampling circuit 420 coupled to an intermediate node of the ring oscillator 410. Sampling circuit 420 includes a reset 422. Since the ring oscillator 410 and the sampling circuit 420 are formed of components from a standard cell library, the components forming the TRNG are limited to those available as part of the collection of well characterized basic circuits that EDA tools use to implement a higher-level circuit design. Example standard cells include logic cells with Boolean logic functions (e.g., AND, NAND, OR, NOR, XOR, XNOR, NOT) and storage cells with storage functions (e.g., flops and latches). Each standard cell, whether a standard cell logic cell or a standard cell storage cell, contains the layout and various logical or simulation views. There can be multiple implementations (and corresponding standard cells) of each logic and storage function that are optimized for features such as area and speed.

Selection of the particular components used for TRNG 400 can involve method 600 described with respect to FIG. 6. Depending on particular application, the sampling circuit 420 can include a gate providing the reset and the sampling element of the sampling circuit 420 can include a flip-flop or latch. The gate has a first input coupled to an intermediate node of the ring oscillator and a second input coupled to a first clock signal line. The flip-flop or latch has a sampling input (the data input) coupled to an output of the gate and a clock input coupled to a second clock signal line.

Figure 4B:
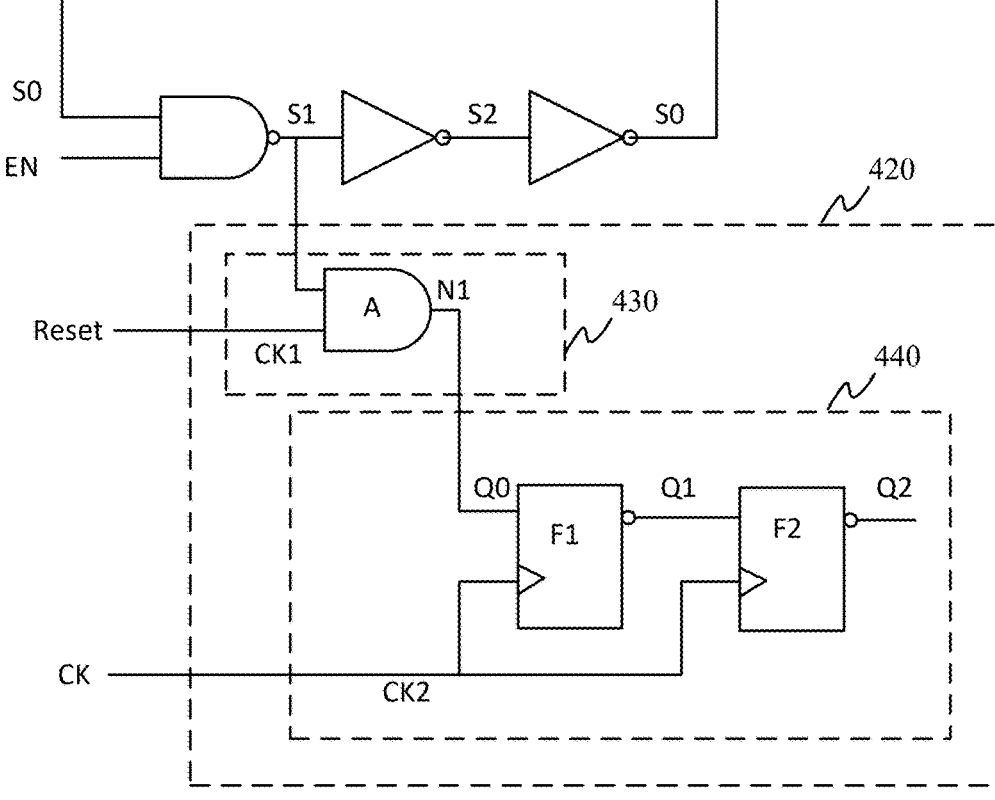
FIG. 4B shows an example implementation of the ring oscillator-based TRNG of FIG. 4A.

FIG. 4B shows an example implementation of the ring oscillator-based TRNG of FIG. 4A. Referring to FIG. 4B, the sampling circuit 420 of FIG. 4A can be implemented by a gate 430 providing the reset and a sampling element 440. The gate 430 has a first input coupled to an intermediate node of the ring oscillator and a second input coupled to a first clock signal line (CK1—the reset signal input). A flip-flop of the sampling element 440 has a sampling input (data input Q0) coupled to an output (N1) of the gate and a clock input coupled to a second clock signal line (CK2).

The second clock signal line (CK2) provides a clock signal having a different frequency than that of the first clock signal line (CK1). In some cases, the second clock signal line operates at twice a speed of the first clock signal line.

The sampling element 440 can include a flop, a latch, or both. In the illustrated example of FIG. 4B, two flops (F1, F2) are used for the sampling element 440.

The particular gate selected for gate 430 can depend on the particular flop or latch used as the sampling element 440. In the illustrated example of FIG. 4B, the gate 430 is an AND gate A. However, other gates may be used including, but not limited to a NAND gate, OR gate, or NOR gate.

Figure 4C:
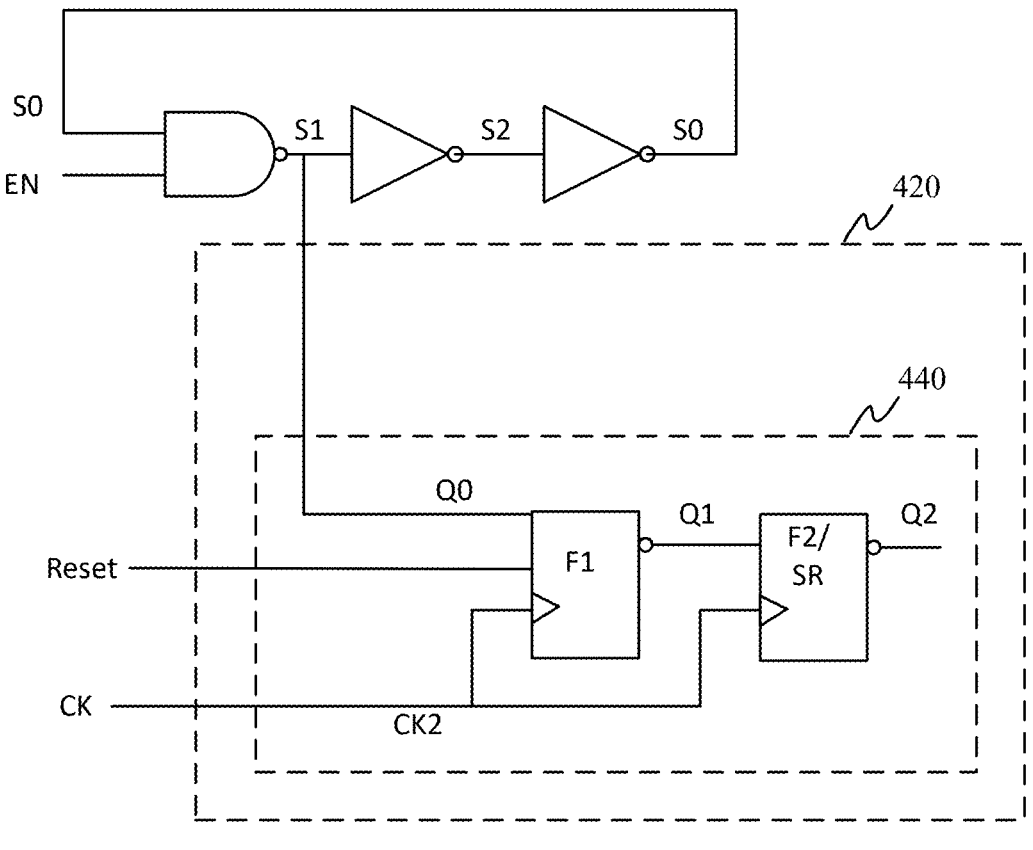
FIG. 4C shows an example implementation of the ring oscillator-based TRNG of FIG. 4A.

In some cases, (shown as FIG. 4C) instead of using a gate as the reset, a flop or latch may be selected for the sampling circuit 420 that has built-in reset functionality. Examples of flops and latches with built-in reset functionality include, but are not limited to, a set/reset (SR) flop (e.g., SR D flip-flop), SR latch, and RS latch.

Figure 5:
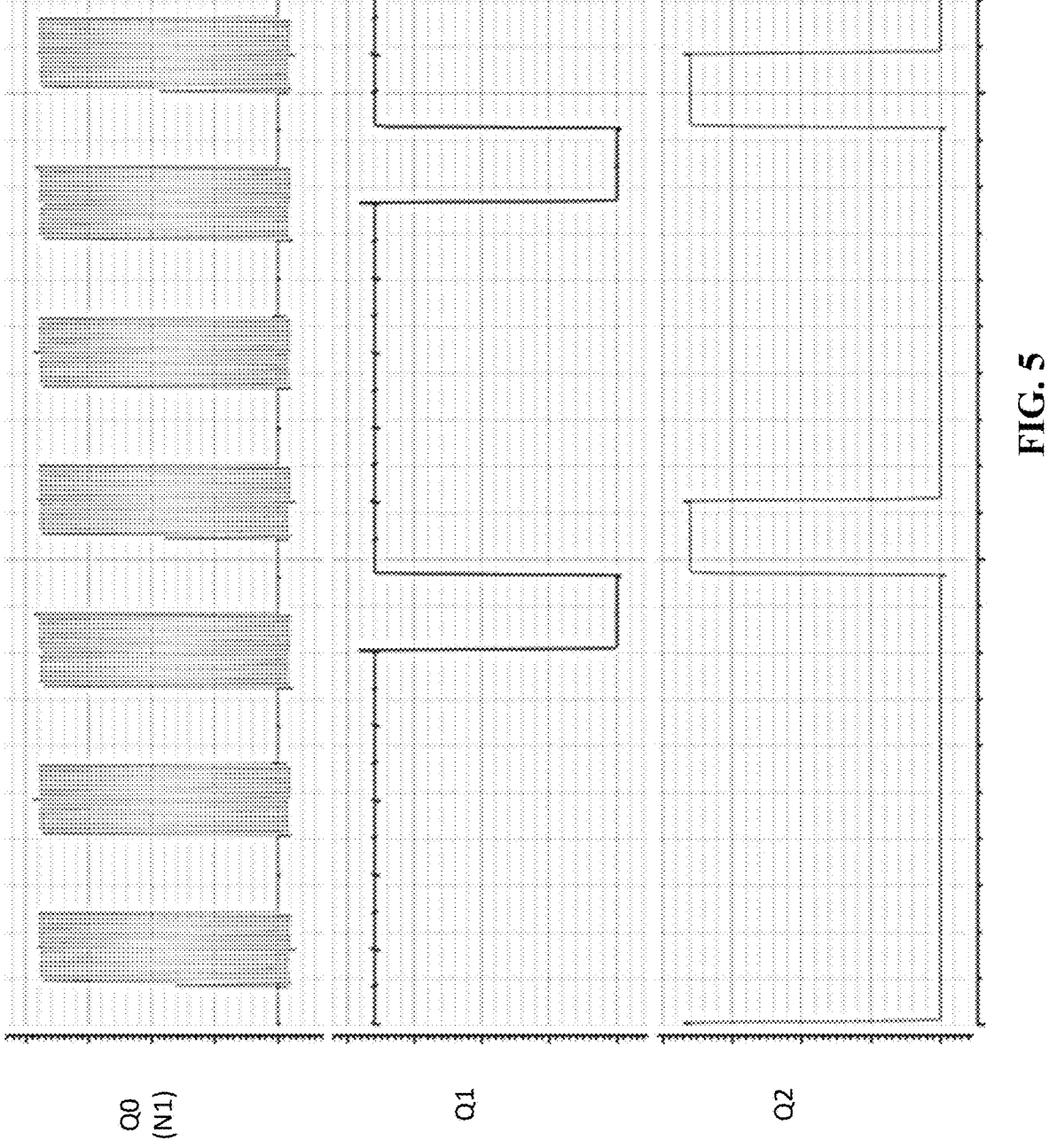
FIG. 5 shows a signal plot illustrating operation of a ring oscillator-based TRNG designed as described herein and operating at the higher oscillation frequency for the ring oscillator.

FIG. 5 shows a signal plot illustrating operation of a ring oscillator-based TRNG designed as described herein and operating at the higher oscillation frequency for the ring oscillator. The simulation reflected in FIG. 5 is based on the design of FIG. 4B. Referring to FIG. 5, it can be seen that sampling of a higher oscillation frequency can be achieved by an additional AND gate A in front of the flip-flop F1. While the oscillation is even faster (the AND gate has lower capacitance than the flip-flop), the same flip-flop can be used to sample randomness. During the quiescent time on Q0 (CK1=0), the stored state of F1 is returned to 0 (1 on inverting output Q1), so that samplings during the time of Q0 activity (CK1=1) sometimes result in 0 on Q1 and sometimes 1.

To understand the use of a sampled ring oscillator as a TRNG, consider a noiseless simulation of a flip-flop sampling high-frequency signal (small period P) using a slow sampling clock. Consider the long term flip-flop's output as a function of the offset t between the start of a period and the active clock edge: f(t). Since the clock is very slow, it is effectively/practically not possible to get an intermediate result (effectively, there is no metastability). Thus, for every t in range from 0 to P, either f(t)=0 (the output is low, 0 V) or f(t)=1 (high, VDD). The flip-flop can be used to generate randomness, if there exist times t0 and t1, such that f(t0)=0 and f(t1)=1. That is, the flip-flop can be used to generate randomness if f(t) is not constant.

A flip-flop has two such functions, one for each initial condition of the flip-flop (f0(t) is the long-term output starting from a flip-flop that stores 0 and f1(t) for the one that stores 1). The fact that f0(t) and f1(t) are not always equal (that is there exists offset t0, such that if the flip-flop were storing 0 before that, it would eventually settle on a different value than if it were storing 1) has performance as well as security implications.

From the performance point of view, it could be that for some small period P, f1 is constant, while f0 is not constant.

That is if the state of the flip-flop is set to some particular value before the randomness sampling, it is possible to use a faster ring oscillator (smaller P).

From the security point of view, the fact that f0 is not always equal to f1, usually also means that the measure (length) of t, such that f0(t)=0 is not equal to the measure for f1(t)=0, that is even after very long sampling time, the next sampled bit depends on the previous sampled bit. This dependency may not be noticeable for long P (since f(t) is not equal f1(t) for a small portion of the period), but it becomes significant for short P.

Accordingly, by selection of appropriate storage element used for the sampling circuit and incorporating a reset, it is possible to improve performance and security. A method is provided for standard cell selection for design of a TRNG, such as TRNG 400 described with respect to FIG. 4A, which can allow for a fast ring oscillator to be sampled without getting stuck. As described herein, steps are performed to find, from a standard cell library, a flop or latch which allows to sample a fastest oscillating signal. The flop or latch is then able to be inserted into a design of a TRNG and an appropriate reset configuration can be found.

FIG. 6 shows a method for standard cell selection for design of a TRNG. Referring to FIG. 6, method 600 can include accessing (610) a set of storage cells from a standard cell library; for each storage cell of the set of storage cells at its initial state, determining (620) a shortest oscillation period of a data input of the storage cell that results in a non-constant output; selecting (630), from results of determining the shortest oscillation period for each storage cell, a particular storage cell having a shorter oscillation period compared to other storage cells of the set of storage cells; and inserting (640) the selected particular storage cell into a design of the TRNG as part of the sampling circuit.

Method 600 further includes selecting the ring oscillator of the TRNG to oscillate slower than the shortest period of the selected particular storage cell. In some cases, the oscillating frequency for the ring oscillator design is automatically adjusted based on the shorted period of the selected particular storage cell. In some cases, recommended oscillating frequencies arc provided for display for a user to make manual changes in a design tool.

The method 600 can be performed by or in conjunction with an EDA tool. The set of storage cells can include standard cells of various flops and latches.

For each storage cell (flip-flops and latches) and for each previously stored state, the shortest period P that results in a non-constant f(t) is determined.

In some cases, determining (620) the shortest oscillation period of the data input of the storage cell that results in the non-constant output includes running a series of simulations where this storage cell is stimulated with an oscillating signal at the data input and a storage triggering signal at the clock input, while observing/capturing the final stable output f(t) at a cell output of the storage cell (e.g., either the stored data or its negation). The function f(t) can be assessed to determine whether the output is constant or non-constant. In detail, to find f(t) for initial state s (0 or 1), period P, and triggering time offset t, run a simulation, where the storage element is initialized to a predefined state s; an oscillating signal with period P is applied to the data input for several periods (e.g., 10 ns, to get into the steady state oscillation of internal nets of the storage element); the clock of an edge-triggered device is activated or the transparency of a latch is disabled with delay based on t; and after a sufficiently long wait (e.g., 10 ns), the final logical value of the output pin is saved as f(t).

Multiple simulations can be performed, for example, where the shortest period is determined by adjusting a frequency of the oscillating signal applied at the data input of the storage cell using a binary search approach. Of course, other approaches besides the binary search approach may be used to find a shortest period that results in a non-constant output.

The function f(t) is assessed to check if f(t) is constant. In some cases, the following algorithm can be used to check if f(t) is constant.

Calculate f(t) (e.g., by performing analog simulation) for a few predefined t and check that not all values are equal. That is, whether f(t) is constant or non-constant can be determined by checking whether values of f(t) for a plurality of predefined t are equal to each other. For flip-flops the recommended values of t are at least P/4 and 3*P/4, while for latches t=0 and t=P/2 (where P is the period and assuming that P starts on an edge of the data input). Thus, the plurality of predefined t includes at least two times selected from t=0, t=¼ period, t=½ period, and t=¾ period.

The results of determining (620) the shortest oscillation period of the data input of the storage cell that results in the non-constant output can be stored. For example, each storage cell can have an associated determined shortest oscillation period. Then, for operation 630, the storage cell having the shortest oscillation period among the other shortest oscillation periods associated with other storage cells can be selected. In this manner, a particular storage cell having a shorter oscillation period compared to other storage cells of the set of storage cells can be selected. For example, the storage cells can be arranged in an ordered list according to their associated determined shortest oscillation periods and the storage cell with the shortest oscillation period (e.g., a first storage cell of a list that is ordered from smallest to largest oscillation period) can be selected.

If a flip-flop or latch is selected (630) as the particular storage cell, the method can further include selecting a gate providing a reset to the flip-flop or latch based on a preferred reset state of the flip-flop or latch. Some flops can perform better when reset to 1; other flops or latches can perform better when reset to 0. Indeed, whether or not the selected particular storage cell has built-in reset functionality, the method can further include determining a preferred reset state of ZERO or ONE for the selected particular storage cell. A preferred reset state is a state that allows sampling of the fastest input.

In some cases, when a gate is included to provide a reset to the flip-flop or latch, an AND gate or NOR gate is selected as the gate for the preferred reset state of 0 and a NAND gate or OR gate is selected as the gate for the preferred reset state of 1. In some cases, other gates may be selected.

When the selected particular storage cell is a flip-flop or latch with built-in reset functionality, an appropriate pin or pins of the flip-flop or latch with built-in reset functionality (e.g., with set and reset) can be selected to be coupled to a reset signal for the reset of the sampling circuit.

Advantageously, ring oscillator-based TRNGs as described herein can be designed using standard cell libraries while allowing for the higher operating frequencies desired by various applications, including cryptographic applications such as key generation and signing.

Figure 7:
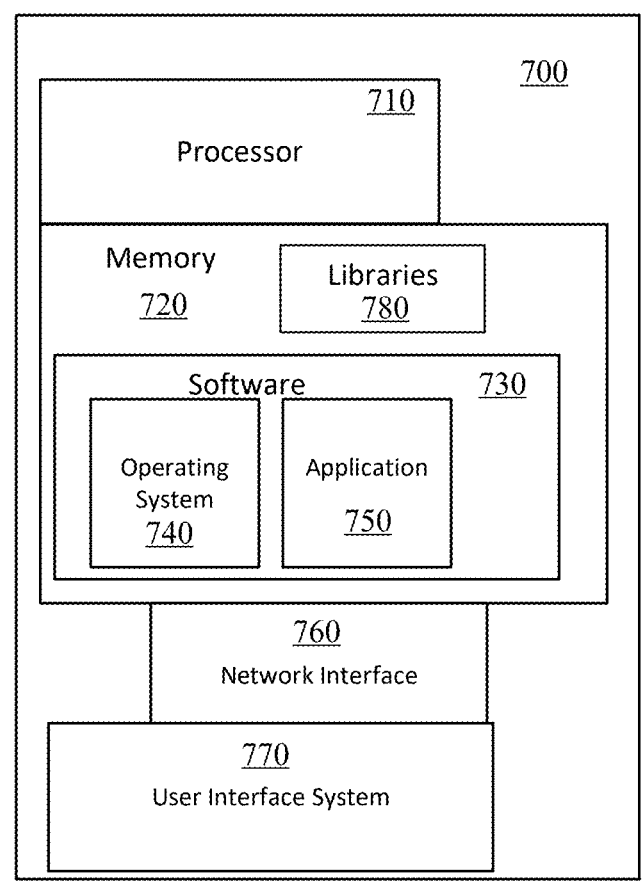
FIG. 7 shows a representative diagram illustrating components of a computing system.

FIG. 7 shows a representative diagram illustrating components of a computing system that may be used in certain implementations described herein. The computing system can be representative of a computing system on which an EDA tool runs as well as the methods for standard cell selection for design of a TRNG as described herein. Referring to FIG. 7, computing system 700 can represent a personal computer, a mobile device, a tablet, a laptop computer, a desktop computer, a server, or a smart television as some examples. Accordingly, more or fewer elements described with respect to computing system 700 may be incorporated to implement a particular computing system.

Referring to FIG. 7, computing system 700 can include at least one processor 710, a memory 720, software 730 that includes operating system 740 and application 750 stored in the memory 720, network interface 760, and user interface 770. Processor 710 processes data and performs operations according to instructions of software 730. Memory 720 may comprise any computer readable storage media readable by processor 710 and capable of storing software 730 including application 750. Memory 720 (and any computer readable storage media forming memory 720) does not consist of propagating signals nor is considered transitory media. Application 750 can include the methods as described (e.g., method 600), an EDA tool, or both (e.g., the methods integrated into the EDA tool, a plug-in and the EDA tool, separate applications, etc.) In some implementations, method 600 can be provided in the form of instructions stored on a computer-readable storage medium that when executed by a computing system such as described with respect to FIG. 7 direct the computing system to perform method 600 and other steps described herein.

700 can further include a user interface 770, which may include input/output (I/O) devices and components that enable communication between a user and the computing system 700 such as, but not limited to, a display, keyboard, mouse, microphone, and speakers. Computing system 700 may also include a network interface 760 that allows the system to communicate with other computing systems, including server computing systems and other client devices, over a network. Network interface 760 can include wired and/or wireless interfaces of one or more communication protocols and/or ports (e.g., for Wi-Fi or Ethernet, BLUETOOTH, near field communication (NFC), etc.) A standard cell library 780 can be stored on memory 720 and/or on a remote memory storage accessible via network interface 760.

In some cases, instructions can be provided that are stored on a computer-readable storage medium that when executed by a computing system (e.g., such as described with respect to FIG. 7) direct the computing system to: find, from a standard cell library, a flop or latch which allows to sample a fastest oscillating signal; insert the flop or latch into a design of a TRNG such as described with respect to FIG. 4A (and FIG. 4B); identify whether the flop or latch has reset functionality; and if the flop or latch does not have reset functionality, determine a gate for providing the reset for the flop or latch, and insert the gate into the design of the TRNG. Such instructions can be provided as a plug-in for an EDA tool or as a standalone tool that communicates with an EDA tool.

In some cases, to determine the gate for providing the reset for the flop or latch, the instructions direct the computing system to: find, from the standard cell library, a logic gate which allows sampling of a fastest oscillating signal by the flop or latch. In some cases, to find the logic gate, the instructions direct the computing system to: determine a preferred reset state of ZERO or ONE for the flop or latch. As explained above, a preferred reset state is a state that allows sampling of a faster oscillating signal than a non-preferred reset state. In some cases, an AND gate or NOR gate is selected for the preferred reset state of ZERO and a NAND gate or OR gate is selected for the preferred reset state of ONE.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A method for standard cell selection for design of a true random number generator (TRNG) comprising a ring oscillator and a sampling circuit coupled to an intermediate node of the ring oscillator, wherein the sampling circuit comprises a reset, the method comprising:

accessing, by a computing system, a set of storage cells from a standard cell library;

for each storage cell of the set of storage cells at its initial state, determining, by the computing system, a shortest oscillation period of a data input of the storage cell that results in a non-constant output;

selecting, by the computing system, from results of determining the shortest oscillation period for each storage cell, a particular storage cell having a shorter oscillation period compared to other storage cells of the set of storage cells; and inserting, by the computing system, the selected particular storage cell into a design of the TRNG as part of the sampling circuit such that data input of the selected particular storage cell is coupled to the intermediate node of the ring oscillator and an output of the selected storage cell provides a sampled signal of the TRNG.

2. The method of claim 1, wherein determining the shortest oscillation period of the data input of the storage cell that results in the non-constant output comprises:

running, by the computing system, a series of simulations where the storage cell is stimulated with an oscillating signal at the data input of the storage cell and a storage triggering signal at a clock input of the storage cell while capturing a final stable output f(t) at a cell output of the storage cell; and assessing f(t), by the computing system, to determine whether f(t) is constant or non-constant.

3. The method of claim 2, wherein determining the shortest period for the oscillating signal at the data input of the storage cell that results in the non-constant output further comprises:

adjusting a frequency of the oscillating signal applied at the data input of the storage cell using a binary search approach.

4. The method of claim 2, wherein assessing f(t) to determine whether f(t) is constant or non-constant comprises checking whether values of f(t) for a plurality of predefined t are equal to each other.

5. The method of claim 4, wherein the plurality of predefined t includes at least two times selected from t=0, t=¼ period, t=½ period, and t=¾ period.

6. The method of claim 1, further comprising:

determining a preferred reset state of ZERO or ONE for the selected particular storage cell, wherein the preferred reset state is a state that allows sampling of a fastest oscillating input.

7. The method of claim 6, wherein the selected particular storage cell is a flip-flop or latch, the method further comprising:

selecting a gate providing a reset to the flip-flop or latch based on the preferred reset state of the flip-flop or latch.

8. The method of claim 7, wherein an AND gate or NOR gate is selected as the gate for the preferred reset state of 0 and a NAND gate or OR gate is selected as the gate for the preferred reset state of 1.

9. The method of claim 6, wherein the selected particular storage cell is a flip-flop or latch with built-in reset functionality, the method further comprising:

selecting an appropriate pin or pins of the flip-flop or latch with built-in reset functionality to be coupled to a reset signal for the reset of the sampling circuit.

10. The method of claim 1, wherein the ring oscillator is selected to oscillate slower than the shortest period of the selected particular storage cell.

11. A non-transitory computer-readable storage medium having instructions stored thereon that when executed by a computing system direct the computing system to:

find, from a standard cell library, a flop or latch which allows to sample a fastest oscillating signal;

insert the flop or latch into a design of a true random number generator (TRNG), the TRNG comprising a ring oscillator and a sampling circuit coupled to an intermediate node of the ring oscillator, wherein the sampling circuit comprises a reset;

identify whether the flop or latch has reset functionality; and if the flop or latch does not have reset functionality, determine a gate for providing the reset for the flop or latch, and insert the gate into the design of the TRNG.

12. The non-transitory computer-readable storage medium of claim 11, wherein to determine the gate for providing the reset for the flop or latch, the instructions direct the computing system to:

find, from the standard cell library, a logic gate which allows sampling of the fastest oscillating signal by the flop or latch.

13. The non-transitory computer-readable storage medium of claim 12, wherein to find the logic gate which allows sampling of the fastest oscillating signal by the flop or latch, the instructions direct the computing system to:

determine a preferred reset state of ZERO or ONE for the flop or latch, wherein the preferred reset state is a state that allows sampling of a faster input signal than a non-preferred reset state of the flop or latch, wherein an AND gate or NOR gate is selected for the preferred reset state of ZERO and a NAND gate or OR gate is selected for the preferred reset state of ONE.

14. A true random number generator (TRNG) comprising:

a ring oscillator; and a sampling circuit coupled to an intermediate node of the ring oscillator, wherein the sampling circuit comprises:

a reset;

a gate providing the reset, the gate having a first input coupled to an intermediate node of the ring oscillator and a second input coupled to a first clock signal line; and a flip-flop or latch having a sampling input coupled to an output of the gate and a clock input coupled to a second clock signal line;

wherein the ring oscillator and the sampling circuit are formed of components from a standard cell library.

15. The TRNG of claim 14, wherein the second clock signal line provides a clock signal having a different frequency than that of the first clock signal line.

16. The TRNG of claim 14, wherein the second clock signal line operates at twice a speed of the first clock signal line.

17. The TRNG of claim 14, wherein the gate comprises an AND gate or a NAND gate.

18. The TRNG of claim 14, wherein the sampling circuit comprises a flop or latch with built-in reset functionality.

19. The TRNG of claim 18, wherein the flop or latch with built-in reset functionality comprises a set/reset flop.

* * * * *